(12) United States Patent
Park

(10) Patent No.: US 11,323,040 B2
(45) Date of Patent: May 3, 2022

(54) DEVICE AND METHOD FOR PROTECTING POWER CIRCUIT OF BASE STATION IN WIRELESS COMMUNICATION SYSTEM

(71) Applicant: Samsung Electronics Co., Ltd., Suwon-si (KR)

(72) Inventor: Jeonggyu Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 16/488,043

(22) PCT Filed: Feb. 20, 2018

(86) PCT No.: PCT/KR2018/002045
§ 371 (c)(1),
(2) Date: Aug. 22, 2019

(87) PCT Pub. No.: WO2018/155873
PCT Pub. Date: Aug. 30, 2018

(65) Prior Publication Data
US 2020/0244186 A1 Jul. 30, 2020

(30) Foreign Application Priority Data
Feb. 22, 2017 (KR) .................. 10-2017-0023471

(51) Int. Cl.
*H02M 3/335* (2006.01)
*H02M 1/32* (2007.01)
(Continued)

(52) U.S. Cl.
CPC ......... *H02M 3/33592* (2013.01); *H02J 50/10* (2016.02); *H02J 50/80* (2016.02); *H02M 1/32* (2013.01); *H02M 3/335* (2013.01); *H02M 7/527* (2013.01); *H04W 88/08* (2013.01); *G01R 19/16571* (2013.01); *H02M 1/0009* (2021.05); *H02M 7/06* (2013.01)

(58) Field of Classification Search
CPC .. H02M 7/527; H02M 3/335; H02M 3/33592; H02J 50/10; H02J 50/80
See application file for complete search history.

(56) References Cited

U.S. PATENT DOCUMENTS 6,130,825 A * 10/2000 Imamura ........... H02M 3/33592
363/17
2003/0067794 A1 4/2003 Boylan et al.
(Continued)

FOREIGN PATENT DOCUMENTS

KR 20-1998-0019930 U 7/1998
KR 10-0593802 B1 7/2006
(Continued)

*Primary Examiner* — Rafael O De Leon Domenech
(74) *Attorney, Agent, or Firm* — Jefferson IP Law, LLP

(57) ABSTRACT

The purpose of the present disclosure is to protect a power circuit of a base station in a wireless communication system, the base station comprising: at least one module for processing a signal; and the power circuit for supplying power to the at least one module. The power circuit comprises a transformer, a rectifier circuit and a smoothing circuit, and the power circuit reduces the ratio of an on-section of the rectifier circuit if a reverse current from the at least one module is detected.

10 Claims, 9 Drawing Sheets

(51) Int. Cl.
*H02M 7/527* (2006.01)
*H04W 88/08* (2009.01)
*H02J 50/80* (2016.01)
*H02J 50/10* (2016.01)
*G01R 19/165* (2006.01)
*H02M 7/06* (2006.01)
*H02M 1/00* (2006.01)

(56) References Cited

U.S. PATENT DOCUMENTS

| | | | | |
|---|---|---|---|---|
| 2007/0041221 | A1* | 2/2007 | Phadke | H02M 3/33576 |
| | | | | 363/16 |
| 2008/0067989 | A1 | 3/2008 | Kasai et al. | |
| 2010/0052420 | A1* | 3/2010 | Kang | H02J 9/005 |
| | | | | 307/31 |
| 2011/0286245 | A1* | 11/2011 | Zhan | H02M 3/33592 |
| | | | | 363/17 |
| 2012/0212195 | A1* | 8/2012 | Kushida | H02M 3/1588 |
| | | | | 323/271 |
| 2013/0063982 | A1* | 3/2013 | Ye | H02M 3/33592 |
| | | | | 363/17 |
| 2015/0036390 | A1* | 2/2015 | Ou | H02M 3/33592 |
| | | | | 363/17 |
| 2015/0229212 | A1 | 8/2015 | Shiwaya | |
| 2015/0349510 | A1* | 12/2015 | Peng | H02H 3/003 |
| | | | | 330/297 |
| 2016/0105094 | A1* | 4/2016 | Tang | H02M 1/36 |
| | | | | 363/21.01 |
| 2017/0170719 | A1* | 6/2017 | Bang | B60L 58/20 |
| 2018/0097400 | A1* | 4/2018 | Vladan | H02J 50/12 |
| 2018/0115252 | A1* | 4/2018 | Chang | H02M 1/08 |
| 2018/0152111 | A1* | 5/2018 | Tschirhart | H02M 1/088 |

FOREIGN PATENT DOCUMENTS

| | | |
|---|---|---|
| KR | 10-2008-0025314 A | 3/2008 |
| KR | 10-1422420 B1 | 7/2014 |
| KR | 10-2015-0084783 A | 7/2015 |

* cited by examiner

DEVICE AND METHOD FOR PROTECTING POWER CIRCUIT OF BASE STATION IN WIRELESS COMMUNICATION SYSTEM

TECHNICAL FIELD

The present disclosure generally relates to a wireless communication system, and more specifically, relates to a device and a method for protecting a power circuit of a base station in the wireless communication system.

BACKGROUND ART

A base station which configures a wireless communication system is infrastructure equipment for providing wireless access to terminals. In general, a network system including the base station supplies power to the system, by using isolated direct current (DC)/DC or alternative current (AC)/DC as a main power source due to power regulations. That is, the base station may include a power circuit which transfers energy through a transformer of which a primary side and a secondary side are isolated media.

A recent radio frequency (RF) system uses a gallium nitride (GaN) amplifier (AMP), and thus a required system voltage fluctuation may be considerable, or load may abruptly change. Hence, a phenomenon in which the power regenerates from the output to the input frequently occurs. However, this is replaced by enhancing withstand voltage and rated current of a field effect transistor (FET) without separate preparation.

DISCLOSURE OF INVENTION

Technical Problem

Based on the discussions as stated above, the present disclosure provides a device and a method for effectively protecting a power circuit of a base station in a wireless communication system.

In addition, the present disclosure provides a device and a method for blocking circuit damage due to reverse current which regenerates output power of an isolated direct current (DC)/DC converter as input power through software control in a wireless communication system.

In addition, the present disclosure provides a device and a method for step-by-step turning off a transistor of a rectifier circuit using digital control in a wireless communication system.

In addition, the present disclosure provides a device and a method for preventing more stable and excessive failure by re-driving a rectifier circuit after reverse current dissipates in a wireless communication system.

Solution to Problem

According to various embodiments of the present disclosure, an apparatus of a base station in a wireless communication system includes at least one module for processing a signal, and a power circuit for supplying power to the at least one module, wherein the power circuit includes a transformer, a rectifier circuit and a smoothing circuit, and if detecting reverse current from the at least one module, the power circuit step-by-step reduces a ratio of an on duration of the rectifier circuit.

According to various embodiments of the present disclosure, an operating method of a base station in a wireless communication system includes detecting reverse current from at least one module which processes a signal to a power circuit which supplies power to the at least one module, and step-by-step reducing a ratio of an on duration of a rectifier circuit of the power circuit.

Advantageous Effects of Invention

A device and a method according to various embodiments of the present disclosure may protect a power circuit, by sequentially turning off a rectifier circuit according to detecting reverse current.

Effects obtainable from the present disclosure are not limited to the above mentioned effects, and other effects which are not mentioned may be clearly understood by those skilled in the art of the present disclosure through the following descriptions.

BEST MODE FOR CARRYING OUT THE INVENTION

Terms used in the present disclosure are used for describing particular embodiments, and are not intended to limit the scope of other embodiments. A singular form may include a plurality of forms unless it is explicitly differently represented. All the terms used herein, including technical and scientific terms, may have the same meanings as terms generally understood by those skilled in the art to which the present disclosure pertains. Among terms used in the present disclosure, the terms defined in a general dictionary may be interpreted to have the same or similar meanings with the context of the relevant art, and, unless explicitly defined in this disclosure, it shall not be interpreted ideally or excessively as formal meanings. In some cases, even terms defined in this disclosure should not be interpreted to exclude the embodiments of the present disclosure.

In various embodiments of the present disclosure to be described below, a hardware approach will be described as an example. However, since the various embodiments of the present disclosure include a technology using both hardware and software, the various embodiments of the present disclosure do not exclude a software-based approach.

Hereafter, the present disclosure relates to a device and a method for protecting a power circuit of a base station in a wireless communication system. Specifically, the present disclosure describes a technique for protecting a rectifier circuit if reverse current from a load occurs in the wireless communication system.

Terms indicating components of a circuit, terms indicating signals, and so on, which are used in the following descriptions, are for the sake of explanations. Accordingly, the present disclosure is not limited to the terms to be described, and may use other terms having technically identical meaning.

Figure 1:
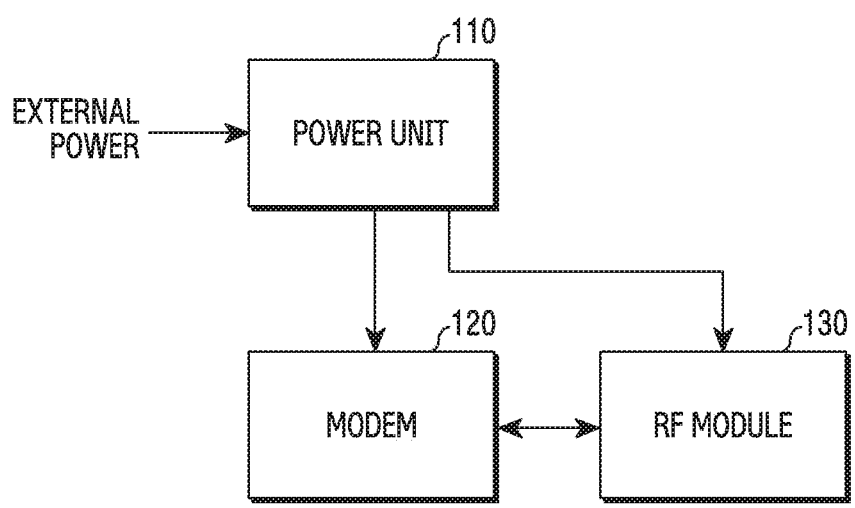
FIG. 1 illustrates a configuration of a base station in a wireless communication system according to various embodiments of the present disclosure.

FIG. 1 illustrates a configuration of a base station in a wireless communication system according to various embodiments of the present disclosure. A term such as 'portion' or '~er' used hereafter indicates a unit for processing at least one function or operation, and may be implemented using hardware, software, or a combination of hardware and software.

Referring to FIG. 1, the base station includes a power unit 110, a modem 120, and a radio frequency (RF) module 130.

The power unit 110 supplies power to the internal components (e.g., the modem 120, the RF module 130) of the base station using external power. For doing so, the power unit 110 may include a circuit for converting the external power to a signal of a necessary form for each of the internal components. For example, the power unit 110 may include a direct current (DC)/DC converter or an alternative current (AC)/DC converter. According to another embodiment, the power unit 110 may use other internal power than the external power. The power unit 110 may be referred to as power circuitry or other term having technically identical meaning The modem 120 and the RF module 130 process signals. In so doing, the modem 120 and the RF module 130 operate using the power supplied from the power unit 110. The modem 120 and the RF module 130 may generate a transmit signal, and process a received signal. In the signal transmission, the modem 120 may generate a baseband signal from data, and the RF module 130 may process up-converting, amplifying, filtering, and so on, of the baseband signal. For doing so, the RF module 130 may include a transmit filter, a receive filter, an amplifier, a mixer, an oscillator, a digital to analog convertor (DAC), an analog to digital convertor (ADC), and so on.

In the power unit 110, the modem 120 and the RF module 130 are treated as loads. The modem 120 and the RF module 130 of FIG. 1 are an example of the load. Accordingly, the base station may further include other component which serves as the load, for example, a component for backhaul communication.

In the embodiment of FIG. 1, the power unit 110 has been described as the separate component from the modem 120 and the RF module 130. However, according to various embodiments, the power unit 110 may be included in the modem 120 or the RF module 130. In this case, the power unit 110 may supply the power exclusively to the belonging component.

In the configuration of the base station of FIG. 1, using the power supplied from the power unit 110, the other component (e.g., the modem 120, the RF module 130) operates. At this time, if the load abruptly increases according to a state change of the other component, reverse current toward the power unit 110 may occur. The internal circuit of the power unit 110 may be damaged by the reverse current. Hence, various embodiments for preventing the damage of the power unit 110 are described in the following.

Figure 2:
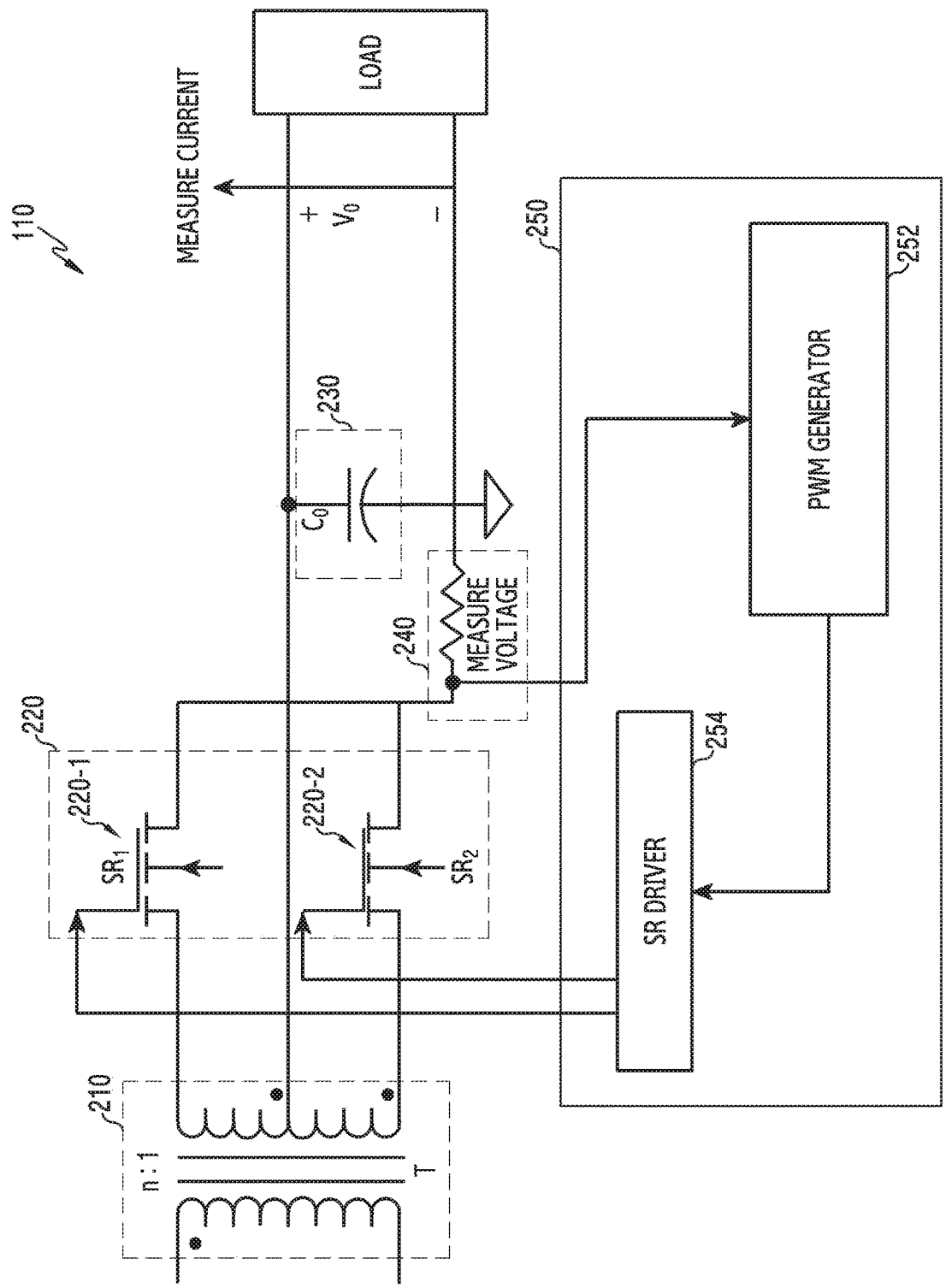
FIG. 2 illustrates a configuration of a power circuit of a base station in a wireless communication system according to various embodiments of the present disclosure.

FIG. 2 illustrates a configuration of a power circuit of a base station in a wireless communication system according to various embodiments of the present disclosure. FIG. 2 illustrates the configuration of the power unit 110 of the base station. A term such as 'portion' or '~er' used hereafter indicates a unit for processing at least one function or operation, and may be implemented using hardware, software, or a combination of hardware and software.

Referring to FIG. 2, the power unit 110 includes a transformer 210, a rectifier 220-1 and 220-2, a smoothing circuit 230, a sensing circuit 240, and a control circuit 250.

The transformer 210 generates a power signal of a desired voltage using external power or other internal power. That is, the transformer 210 adjusts voltage of the external power or the other internal power. The transformer 210 includes a primary coil and a secondary coil, the external power passes the primary coil, and thus the power signal is generated at the secondary coil. In so doing, the voltage may drop according to a ratio of windings of the primary coil and the secondary coil. At this time, the power signal generated at the secondary coil is an AC signal.

The rectifier 220 converts the AC power signal generated at the transformer 210 to a DC power signal. According to an embodiment, the rectifier 220 is a synchronous rectifier (SR), and may include a first transistor 220-1 and a second transistor 220-2. In this case, the rectifier 220 may operate by repetitive on/off of the first transistor 220-1 and the second transistor 220-2. The rectifier 210 may be referred to as rectifying circuitry or other term having technically identical meaning.

The smoothing circuit 230 removes a ripple component of the power signal outputted by the rectifier 220. The smoothing circuit 230 may be configured with a low-band filter, and may include, for example, at least one capacitor. A cut-off frequency of the smoothing circuit 230 may be designed quite smaller than a frequency of the ripple component.

The sensing circuit 240 detects current on a path which supplies the power to a load (e.g., the modem 120, the RF module 130, etc.). For doing so, the sensing circuit 240 may include at least one resistor. The sensing circuit 240 provides the measured current to the control circuit 250.

The control circuit 250 controls the rectifier 220 according to the current measured by the sensing circuit 240. The control circuit 250 may be implemented with firmware or hardware logic. According to various embodiments of the present invention, the control circuit 250 may detects reverse current from the load, and changes an operation state of the rectifier 220 according to the detection of the reverse current. For example, if detecting the reverse current, the control circuit 250 may adjust a ratio of an on duration of the first transistor 220-1 and the second transistor 220-2. Herein, the on duration indicates a duration where the rectification function of the first transistor 220-1 and the second transistor 220-2 is activated, and may be referred to as an 'active duration', 'operation duration' or other term having technically identical meaning.

To adjust the ratio of the on duration, the control circuit 250 may generate a control signal for controlling the first transistor 220-1 and the second transistor 220-2. Herein, the control signal is a pulse width modulation (PWM) signal, and the ratio of the on duration of the first transistor 220-1 and the second transistor 220-2 may be adjusted according to a duty ratio of the PWM signal. Specifically, the control circuit 250 may include a PWM generator 252 which generates the PWM signal, and an SR driver 254 which generates a physical signal for controlling the first transistor 220-1 and the second transistor 220-2 according to the PWM signal.

Figure 3:
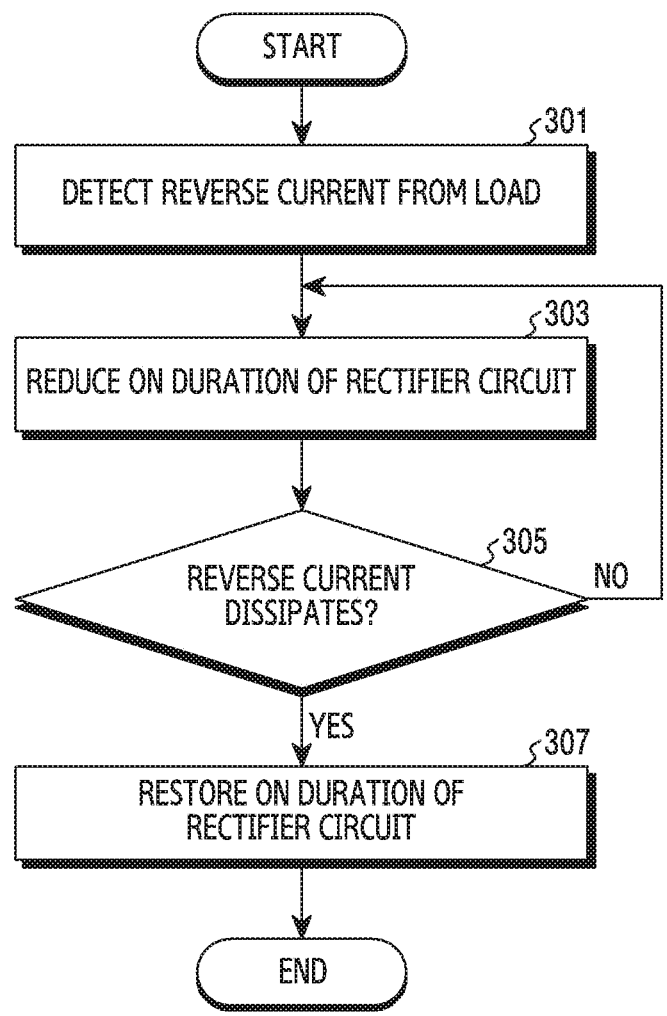
FIG. 3 illustrates an operating method of a power circuit in a wireless communication system according to various embodiments of the present disclosure.

FIG. 3 illustrates an operating method of a power circuit in a wireless communication system according to various embodiments of the present disclosure. FIG. 3 illustrates an operating method of the power unit 110.

Referring to FIG. 3, in step 301, the power unit 110 detects reverse current from a load. Herein, the load is a component which operates using power supplied from the power unit 110, and may include, for example, the model 120, the RF module 130, and so on. For example, the control circuit 250 of the power unit 110 may detect occurrence of the reverse current based on measured current provided from the sensing circuit 240.

In step 303, the power unit 110 reduces the ratio of the on duration of the rectifier circuit. For doing so, the power unit 110 may reduce the duty ratio of the PWM signal for controlling the rectifier 220. The PWM signal includes a first control signal for the first transistor 220-1 and a second control signal for the second transistor 220-2, and the duty ratios of the first control signal and the second signal may be reduced equally.

Next, in step 305, the power unit 110 identifies whether the reverse current dissipates. That is, the power unit 110 determines whether the reverse current is not further detected. If the reverse current does not dissipate, the power unit 110 returns to step 303, and further reduces the on duration of the rectifier 220. Hence, while the reverse current is detected, the on duration of the rectifier 220 is sequentially reduced, and the first transistor 220-1 and the second transistor 220-2 of the rectifier 220 are turned off step by step. The sequential reduction of the on duration by repeating step 205 may be referred to as 'step-by-step turn-off', 'soft turn-off' or other term having technically identical meaning.

By contrast, if the reverse current dissipates, in step 307, the power unit 110 restores the on duration of the rectifier circuit. That is, the power unit 110 adjusts the on duration of the rectifier circuit the same as before the revere current detection. According to another embodiment, the power unit 110 may gradually return to a normal state, by sequentially increasing the on duration. According to yet another embodiment, the power unit 110 may adjust the on duration in a length corresponding to a magnitude of the measured current.

Figure 4:
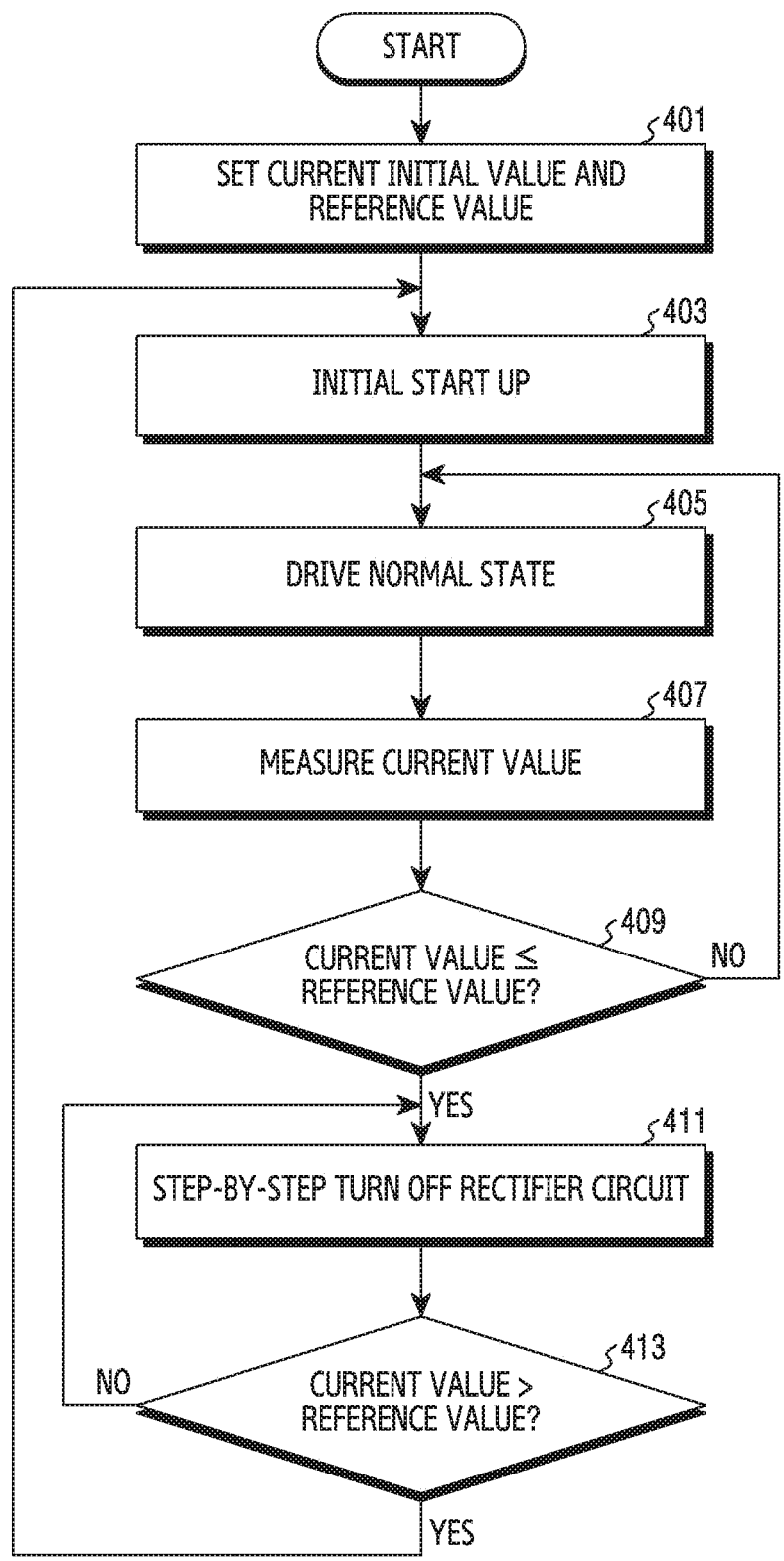
FIG. 4 illustrates a more detailed operating method of a power circuit in a wireless communication system according to various embodiments of the present disclosure.

FIG. 4 illustrates a more detailed operating method of a power circuit in a wireless communication system according to various embodiments of the present disclosure. FIG. 4 illustrates an operating method of the power unit 110.

Referring to FIG. 4, in step 401, the power unit 110 sets a current initial value and a reference value. Herein, the current initial value is a current value of an initial state of the power unit 110. The reference value is a variable for detecting occurrence of the reverse current, and is a threshold for determining the reverse current. That is, the power unit 110 may initialize the current and all variables, and set the reference value which is a negative value of a particular level.

In step 403, the power unit 110 initially starts up. That is, the power unit 110 initiates power supply.

In step 405, the power unit 110 operates in the normal state. In so doing, the rectifier 220 operates in the on duration corresponding to the normal state. That is, the duty ratio of the control signals for the first transistor 220-1 and the second transistor 220-2 corresponds to the normal state. For example, in the normal state, the duty ratio may be a maximum value.

In step 407, the power unit 110 measures a current value. For example, the power unit 110 measures the current flowing on a path between the secondary coil of the transformer 210 and the load. For doing so, the sensing circuit 240 may be used. In so doing, if the control circuit 250 is implemented digitally, the control circuit 250 may convert the secondary side current value to a digital value by use of an ADC.

In step 409, the power unit 110 determines whether the current value is equal to or smaller than the reference value. That is, the power unit 110 compares the measured current value with the reference value. If the current value is smaller than the reference value, the power unit 110 returns to step 405 and maintains the normal state operation.

By contrast, if the current value is equal to or smaller than the reference value, in step 411, the power unit 110 turns off the rectifier circuit 220 step by step. For example, the power unit 110 sequentially reduces the on duration of the first transistor 220-1 and the second transistor 220-2 included in the rectifier circuit 220. In other words, if the current value is equal to or smaller than the reference value which is the negative value of the particular level, the power unit 110 turns off the rectifier circuit 220 according to the sequential reduction of the duty ratio in a specific timer interrupt cycle.

Next, in step 413, the power unit 110 determines whether the current value exceeds the reference value. That is, the power unit 110 compares the measured current value with the reference value. If the current value is equal to or smaller than the reference value, the power unit 110 returns to step 411 and continues the turn-off operation of the rectifier circuit 220. By contrast, if the current value is equal to or greater than the reference value, the power unit 110 returns to step 403 and re-performs the initial start-up. That is, if the current value measured in the step-by-step turn-off operation of the rectifier circuit 220 rises over the reference value, the power unit 110 operates the rectifier circuit 220 with the PWM signal of the duty ratio corresponding to the normal state again. Yet, according to another embodiment, if the current value is equal to or greater than the reference value, the power unit 110 returns to step 403 and initially drives only the rectifier circuit 220.

As stated above, the power unit 110 controls the rectifier circuit 220, based on the current value flowing on the path between the secondary coil of the transformer 210 and the load. Thus, damage of the rectifier circuit 220 due to the reverse current may be prevented. For doing so, the power unit 110 includes the control unit 250. Herein, the control unit 250 may be implemented digitally and in analog, and various embodiments for implementing the control circuit 250 are described hereafter.

Figure 5:
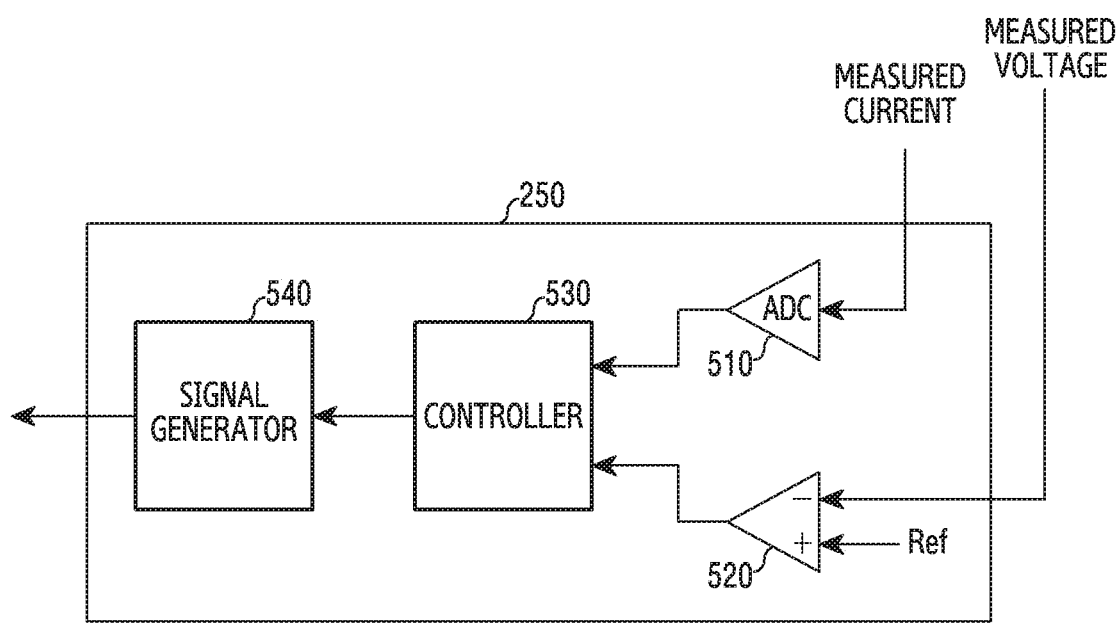
FIG. 5 illustrates a configuration example of a control circuit implemented digitally in a wireless communication system according to various embodiments of the present disclosure.

FIG. 5 illustrates a configuration example of a control circuit implemented digitally in a wireless communication system according to various embodiments of the present disclosure. FIG. 5 illustrates the configuration of the control circuit 250. A term such as 'portion' or '~er' used hereafter indicates a unit for processing at least one function or operation, and may be implemented using hardware, software, or a combination of hardware and software.

Referring to FIG. 5, the control circuit 250 includes an ADC 510, a comparator 520, a controller 530, and a signal generator 540.

The ADC 510 converts measured current (hereafter, 'measured current') provided from the sensing circuit 240 to a digital value. That is, the ADC 510 converts a value indicating the current flowing on the path between the secondary coil of the transformer 210 and the load to the digital value. In other words, the ADC 510 converts the current value into a form recognizable by the controller 530.

The comparator 520 outputs a difference value of a voltage value (hereafter, 'measured voltage') applied to the load and a reference value Ref. The reference value Ref is a desired target voltage value to be outputted to the load. Hence, the output of the comparator 520 is an error value of the voltage, and may be referred to as a voltage error feedback. Herein, the measured voltage indicates the voltage $V_O$ of FIG. 2. The voltage $V_O$ may be inputted to the comparator 520, or may be adjusted by a gain control circuit (not shown) and then inputted. Yet, according to another embodiment, the voltage error feedback may not be considered. In this case, the comparator 520 may be excluded.

The controller 530 determines the operation state of the rectifier circuit 220 based on at least one of the measured current provided from the ADC 510 and the voltage error feedback provided from the comparator 520. For example, the controller 530 may compare the measured current with the reference value, and determine occurrence of the reverse current if the measured current is lower than the reference value. Herein the reference value may be a negative number. Yet, according to the implementation, if the measured current is greater than the reference value, the occurrence of the reverse current may be determined. According to determining the reverse current, the controller 530 may determine the step-by-step turn-off of the rectifier circuit 220. Thus, the controller 530 controls the signal generator 540 to generate a PWM signal for the step-by-step turn-off. Accordingly, while the situation in which the measured current value is equal to or smaller than the reference value continues, the duty ratio of the PWM signal generated by the signal generator 540 sequentially reduces.

The signal generator 540 generates the PWM signal under the control of the controller 530. For doing so, the signal generator 540 may receive a signal indicating the duty ratio of the PWM signal, or receive a signal indicating the operation state of the rectifier circuit 220. For example, the signal indicating the operation state of the rectifier circuit 220 may indicate the step-by-step turn-off, the normal operation recovery, and so on.

Figure 6A:
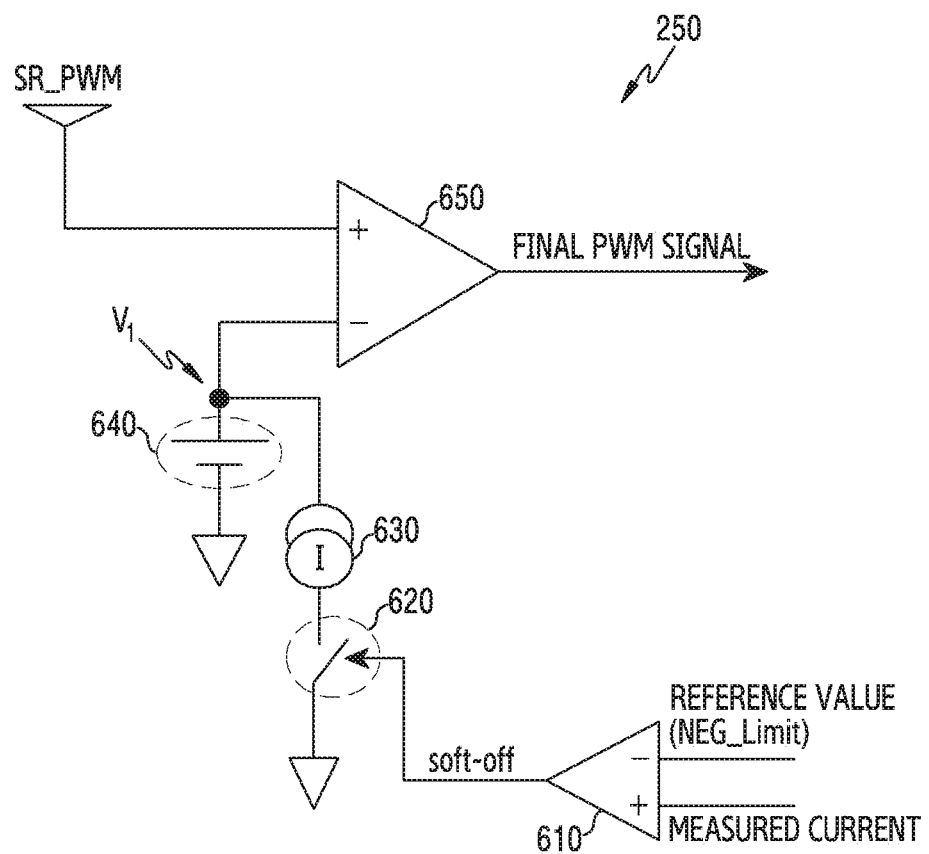
FIG. 6A illustrates a configuration example of a control circuit implemented in analog in a wireless communication system according to various embodiments of the present disclosure.

FIG. 6A illustrates a configuration example of a control circuit implemented in analog in a wireless communication system according to various embodiments of the present disclosure. FIG. 6 illustrates the configuration of the control circuit 250. A term such as 'portion' or '~er' used hereafter indicates a unit for processing at least one function or operation, and may be implemented using hardware, software, or a combination of hardware and software. Referring to FIG. 6A, the control circuit 250 includes a first comparator 610, a switch 620, a current source 630, a voltage source 640, and a second comparator 650.

Figure 6B:
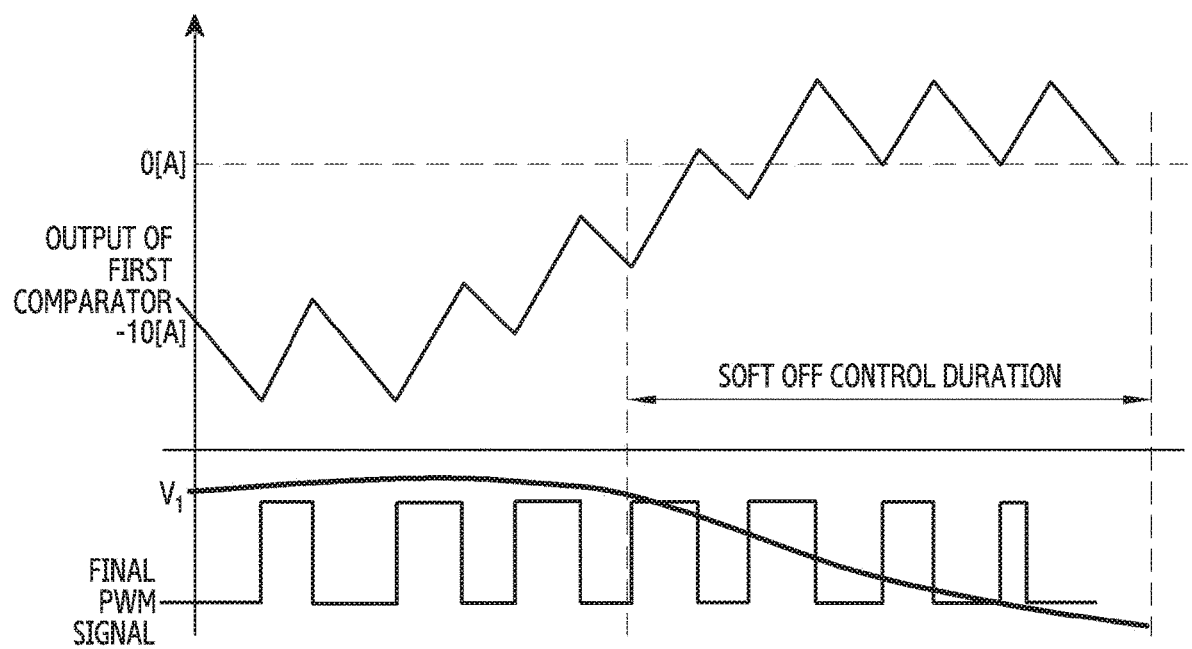
FIG. 6B illustrates an example of a control signal generated by a control circuit of FIG. 6A in a wireless communication system according to various embodiments of the present disclosure.

The first comparator 610 compares the measured current with the reference value. The switch 620 is turned on/off according to an output of the first comparator 610. The second comparator 650 compares a PWM signal SR_PWM of the normal state and voltage $V_1$. A final PWM signal is generated based on a comparison result of the PWM signal SR_PWM of the normal state and the voltage $V_1$. If the measured current is equal to or smaller than the reference value, the first comparator 610 turns on the switch 620. If the switch 620 transits to the on state, the current source 620 is connected to a ground. Hence, as shown in FIG. 6B, as the output of the first comparator 610 is changed to a positive number, the voltage $V_1$ decreases. Hence, the duty ratio of the final PWM signal reduces.

Figure 7A:
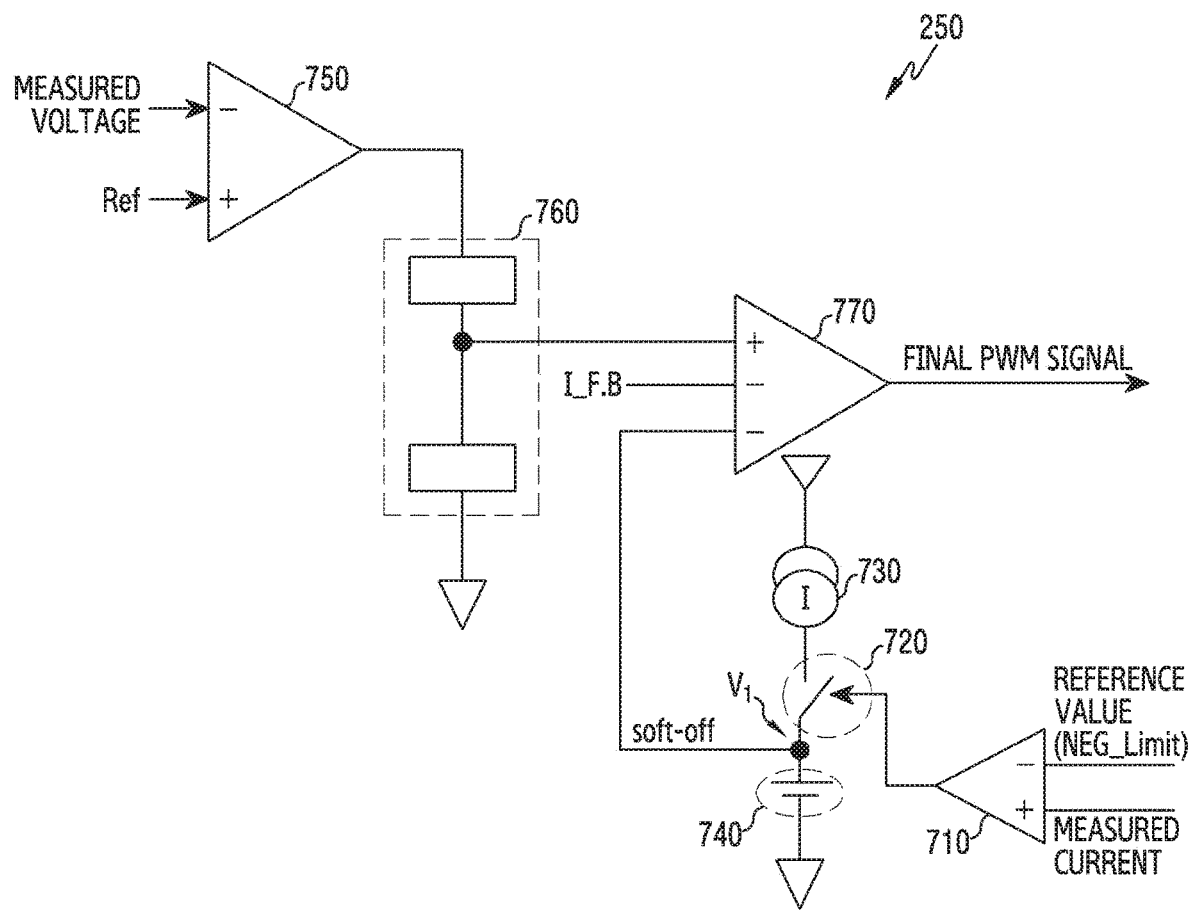
FIG. 7A illustrates another configuration example of a control circuit implemented in analog in a wireless communication system according to various embodiments of the present disclosure.

FIG. 7A illustrates another configuration example of a control circuit implemented in analog in a wireless communication system according to various embodiments of the present disclosure. FIG. 7A illustrates the configuration of the control circuit 250. A term such as 'portion' or '~er' used hereafter indicates a unit for processing at least one function or operation, and may be implemented using hardware, software, or a combination of hardware and software. Referring to FIG. 7A, the control circuit 250 includes a first comparator 710, a switch 620, a current source 630, a voltage source 740, a second comparator 750, a gain control circuit 760, and a third comparator 770.

Figure 7B:
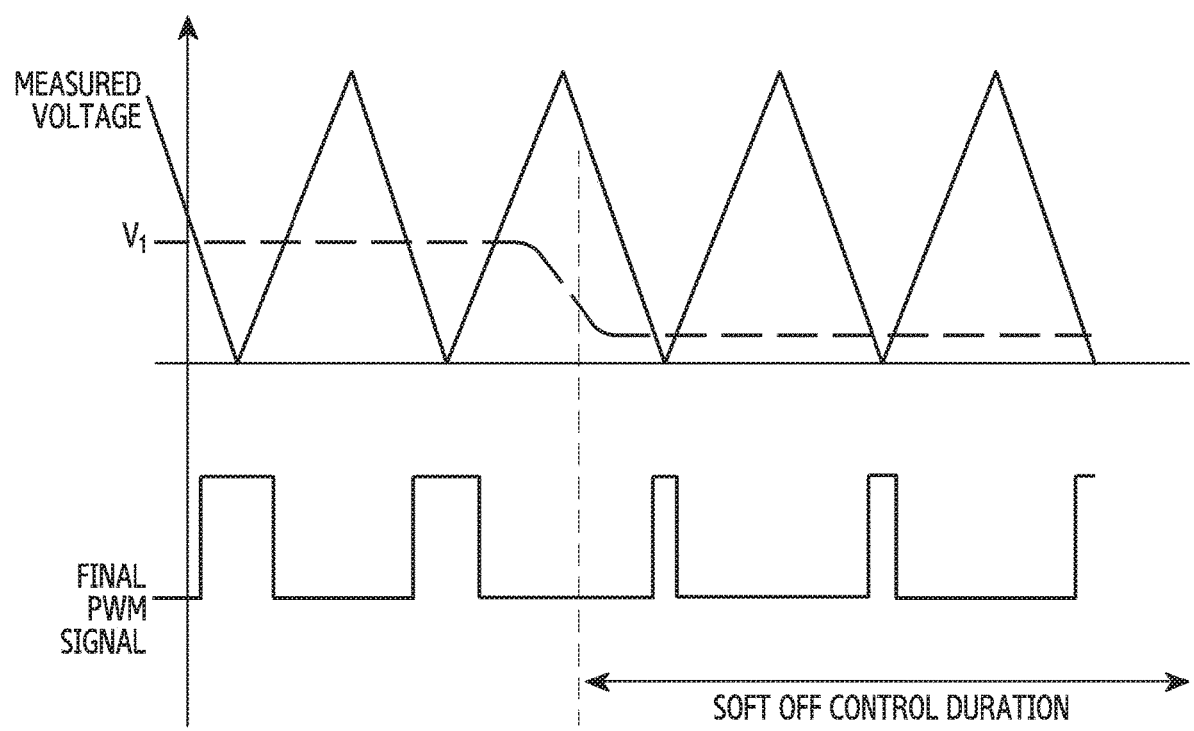
FIG. 7B illustrates an example of a control signal generated by a control circuit of FIG. 7A in a wireless communication system according to various embodiments of the present disclosure.

The first comparator 710 compares the measured current with the reference value. The switch 720 is turned on/off according to an output of the first comparator 710. The second comparator 750 compares the measured voltage and the target voltage. The gain control circuit 760 adjusts the magnitude of the output of the second comparator 750. Each block of the gain control circuit 760 may include a resistor. The third comparator 770 generates a final PWM signal based on the voltage error feedback, I_F.B (e.g., the PWM signal of the normal state), and voltage $V_1$. If the measured current is equal to or smaller than the reference value, the first comparator 710 turns on the switch 720. If the switch 720 transits to the on state, the current source 730 is connected to a node of the voltage $V_1$. Hence, as shown in FIG. 7B, the voltage $V_1$ decreases, and the duty ratio of the final PWM signal reduces.

The methods according to the embodiments described in the claims or the specification of the present disclosure may be implemented in hardware, software, or a combination of hardware and software.

For the software implementation, a computer-readable storage medium which stores one or more programs (software modules) may be provided. One or more programs stored in the computer-readable storage medium may be configured for execution by one or more processors of a device. One or more programs may include instructions for enabling the device to execute the methods according to the embodiments disclosed in the claims or the specification of the present disclosure.

Such a program (software module, software) may be stored to a random access memory, a non-volatile memory including a flash memory, a read only memory (ROM), an electrically erasable ROM (EEPROM), a magnetic disc storage device, a compact disc (CD)-ROM, digital versatile discs (DVDs) or other optical storage devices, and a magnetic cassette. Alternatively, the programs may be stored to a memory combining part or all of them. Also, a plurality of memories may be included.

Also, the programs may be stored in an attachable storage device accessible via a communication network such as Internet, Intranet, local area network (LAN), wide LAN (WLAN), or storage area network (SAN), or a communication network by combining these networks. Such a storage device may access an apparatus which realizes an embodiment of the present disclosure through an external port. Also, a separate storage device on the communication network may access the apparatus which realizes an embodiment of the present disclosure.

In the specific embodiments of the present disclosure as described above, the elements included in the disclosure are expressed in a singular or plural form. However, the singular or plural expression is appropriately selected according to a proposed situation for the convenience of explanations, the present disclosure is not limited to a single element or a plurality of elements, the elements expressed in the plural form may be configured as a single element, and the elements expressed in the singular form may be configured as a plurality of elements.

Meanwhile, the detailed description of the present disclosure has been described with reference to certain embodiments thereof, but various modifications may be made without departing from the scope of this disclosure. Therefore, the scope of this disclosure should not be limited to the described embodiments but should be defined by the claims as below and their equivalents within the scope of the claims.

What is claimed is:

1. An apparatus for a base station in a wireless communication system, the apparatus comprising:
    at least one module for processing a signal; and
    a power circuit for supplying power to the at least one module,
    wherein the power circuit comprises a transformer, a rectifier circuit and a smoothing circuit, and
    wherein the power circuit repeats following steps until reverse current is not detected from the at least one module:
        if the reverse current is detected from the at least one module for a first time, reducing a ratio of an on duration of the rectifier circuit;
        identifying whether the reverse current is not detected from the at least one module in response to reducing the ratio of the on duration of the rectifier circuit for the first time; and
        if the reverse current is detected from the at least one module for a second time, reducing a lager ratio of the on duration of the rectifier circuit than the first time.

2. The apparatus of claim 1,
    wherein the rectifier circuit comprises a first transistor and a second transistor, and
    wherein the power circuit comprises a control circuit which generates pulse width modulation (PWM) signals for controlling operations of the first transistor and the second transistor.

3. The apparatus of claim 2, wherein the control circuit sequentially reduces a duty ratio of the PWM signals, while the reverse current occurs.

4. The apparatus of claim 3, wherein, if a current value flowing on a path between a secondary coil of the transformer and the at least one module is smaller than or equal to a reference value, the control circuit determines occurrence of the reverse current.

5. The apparatus of claim 3, wherein, if the reverse current dissipates, the control circuit restores the duty ratio to a normal state.

6. A method for operating a base station in a wireless communication system, the method comprising:
    detecting reverse current from at least one module which processes a signal to a power circuit which supplies power to the at least one module; and
    repeating following steps until the reverse current is not detected from the at least one module:
        if the reverse current is detected from the at least one module for a first time, reducing a ratio of an on duration of a rectifier circuit of the power circuit;
        identifying whether the reverse current is not detected from the at least one module in response to reducing the ratio of the on duration of the rectifier circuit for the first time; and
        if the reverse current is detected from the at least one module for a second time, reducing a lager ratio of the on duration of the rectifier circuit than the first time.

7. The method of claim 6,
    wherein the rectifier circuit comprises a first transistor and a second transistor, and
    wherein the power circuit comprises a control circuit which generates pulse width modulation (PWM) signals for controlling operations of the first transistor and the second transistor.

8. The method of claim 7, wherein the reducing of the ratio of the on duration comprises:
    sequentially reducing a duty ratio of the PWM signals, while the reverse current occurs.

9. The method of claim 8, wherein the detecting of the reverse current comprises:
    if a current value flowing on a path between a secondary coil of a transformer of the power circuit and the at least one module is smaller than or equal to a reference value, determining occurrence of the reverse current.

10. The method of claim 8, further comprising:
    if the reverse current dissipates, restoring the duty ratio to a normal state.

* * * * *